United States Patent [19]

Matsumoto et al.

[11] Patent Number: 4,598,402
[45] Date of Patent: Jul. 1, 1986

[54] SYSTEM FOR TREATMENT OF SINGLE BIT ERROR IN BUFFER STORAGE UNIT

[75] Inventors: Toshio Matsumoto; Motokazu Kato, both of Kawasaki, Japan

[73] Assignee: Fujitsu Limited, Kawasaki, Japan

[21] Appl. No.: 549,462

[22] Filed: Nov. 7, 1983

[30] Foreign Application Priority Data

Dec. 25, 1982 [JP] Japan ................. 57-231874

[51] Int. Cl.[4] ............................................ G06F 11/10
[52] U.S. Cl. ........................................ 371/38; 371/13
[58] Field of Search ............... 371/10, 15, 13, 21, 371/30, 37–39, 72; 324/73 R, 73 AT

[56] References Cited

U.S. PATENT DOCUMENTS

| 4,051,461 | 9/1977 | Hashimoto et al. | 371/10 X |
|---|---|---|---|
| 4,201,337 | 5/1980 | Lewis et al. | 371/37 |
| 4,249,253 | 2/1981 | Gentili et al. | 371/38 |
| 4,255,808 | 3/1981 | Schaber | 371/38 |
| 4,319,356 | 3/1982 | Kocol et al. | 371/38 |
| 4,371,930 | 2/1983 | Kim | 371/38 X |
| 4,394,763 | 7/1983 | Nagano et al. | 371/38 |
| 4,456,993 | 6/1984 | Taniguchi et al. | 371/10 |
| 4,458,349 | 7/1984 | Aichelmann, Jr. et al. | 371/38 X |
| 4,493,075 | 1/1985 | Anderson et al. | 371/10 |

OTHER PUBLICATIONS

Kerchmar et al., "Use of Memory Cache for Main Memory Failure Mode Analysis", *IBM Technical Disclosure Bulletin*, vol. 25, No. 4, Sep. 1982, pp. 1849–1852.

Primary Examiner—Gary V. Harkcom
Attorney, Agent, or Firm—Staas & Halsey

[57] ABSTRACT

In a data processing device comprising a main storage unit, a buffer storage unit, and an error check and correction circuit, when data held in the buffer storage unit contains a single-bit error, the data containing the single-bit error is moved out from the buffer storage unit by generating a predetermined number of addresses having the same number (memory sector) as the data containing the single-bit error. The data is then corrected by the error check and correction circuit, and the corrected data is stored in the main storage unit.

11 Claims, 4 Drawing Figures

Fig. 2A

| MS - ASS | SET NO. | BYTE NO. |
|---|---|---|
| BIT 0 ... BIT 15 | BIT 16 ... BIT 25 | BIT 26 ... BIT 31 |

Fig. 2B

|  | SET 0 | SET 1 | ---- | SET 1023 |
|---|---|---|---|---|
| ASS 0 | $A_0$ | | | |
| 1 | B | | | |
| 2 | C | | | |
| 3 | D | | | |

Fig. 2C

| $A_0$ | | | | | | | |
| $A_1$ | | | | | | | |
| $A_2$ | | | | | | | |
| $A_3$ | | | | | | | |
| $A_4$ | | | | | | | |
| B | | | | | | | |
| C | | | | | | | |
| D | | | | | | | |
| 64 bytes | | | | | | | |

SET 0, SET 1, ----, SET 1023

SYSTEM FOR TREATMENT OF SINGLE BIT ERROR IN BUFFER STORAGE UNIT

BACKGROUND OF THE INVENTION

1. Field of the Invention

The present invention relates to a system for treatment of a single-bit error in a buffer storage unit of a set-associative type provided in a data processing device having an error check and correct (ECC) circuit for single-bit error correction and plural-bit error detection.

2. Description of the Prior Art

Storage devices occasionally suffer from errors of data stored in their memory elements. These include bit-inversion errors produced by α-rays and so on, such errors being known as "soft errors" to distinguish them from "hard errors" caused by hardware malfunctions. Soft errors can be corrected by rewriting the correct data into the memory elements. In prior art storage devices, correction of soft errors has been effected by the method of rewriting the data containing errors using a patrol function or the method of rewriting the data containing errors when that part of the stored data is rewritten in the storage device.

In the first method, it is necessary to access all the memory elements in the storage device. Thus, it takes a long time to correct the data containing errors. In the second method, on the other hand, the error data can be corrected only during partial writing and cannot be corrected at the time of reading. In the latter case, data can be corrected by the ECC circuit as it is read, thus there are no single-bit errors in the reading of data. The data containing errors, however, remains stored in the storage device. Thus, every time a read command for an address in which there is a single-bit error is executed by the buffer storage unit of the storage device, a machine check interrupt for a single-bit error is generated.

If such machine check interrupts are produced more than a predetermined number of times during a certain time interval, the software control shuts off the control mask for the system recovery (SR) interrupt and enters a quiet mode in which the SR class machine check interrupt is not accepted. SR class machine check interrupts, however, include not only correction of single-bit errors, but also the success of command retries, etc. Therefore, it is desirable that the data processing device not enter the quiet mode very often. Accordingly, the second method is disadvantageous when data with a single-bit error in the buffer storage unit is accessed repeated over a short time period.

SUMMARY OF THE INVENTION

An object of the present invention is to provide a system for treatment of single-bit errors in a buffer storage unit in which the unit is prevented from readily entering the quiet mode due to frequent machine check interrupts generated by repeatedly accessing data containing a single bit error.

The system for treatment of a single-bit error in a buffer storage unit in accordance with the present invention, is adapted for a data processing device which includes: a main storage unit; a buffer storage unit holding a portion of the data stored in the main storage unit in a set-associative manner; and an ECC circuit functioning to check and correct single-bit errors and to detect plural-bit errors. The data stored in the buffer storage unit is replaceable with data in the main storage unit in N (more than 1) ways.

The system also includes a device for holding an address of data, read from the buffer storage unit, which is found to contain a single-bit error and a device for generating an address for the main storage unit. When a single-bit error is detected in data read from the buffer storage unit, main storage addresses, corresponding to the "SET" (memory sector) of the buffer storage unit which includes the data containing the single-bit error, are generated by the memory address generating device a predetermined number of times. The data held in the SET of the buffer storage unit which includes the data containing the single-bit error is moved out of the buffer storage unit. The data containing the single-bit error is thereupon checked and corrected in the ECC circuit, and the corrected data is stored in the main storage unit.

BRIEF DESCRIPTION OF THE DRAWINGS

FIGS. 2A, 2B and 2C illustrate memory structures of an error address register, a buffer storage unit, and a main storage unit, respectively.

DESCRIPTION OF THE PREFERRED EMBODIMENTS

Figure 1:
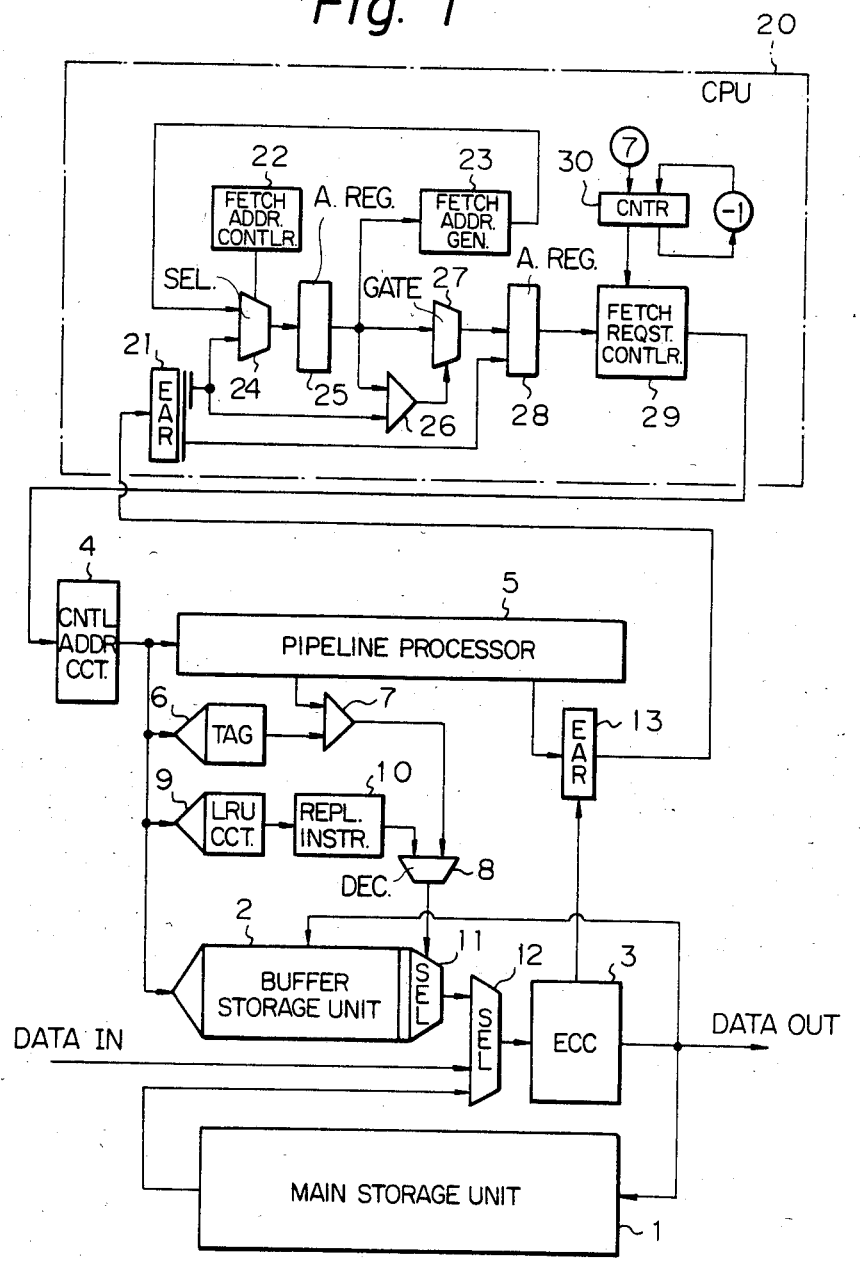
FIG. 1 is a block diagram of a system for treatment of single-bit errors in a buffer storage unit in accordance with one embodiment of the present invention.

Before describing the preferred embodiments, the principle of the present invention will be described briefly. In a data processing device having a main storage unit and a buffer storage unit holding part of the data stored in the main storage unit in a set-associative manner, when the data held in the buffer storage unit is replaced with other data stored in the main storage unit, the data moved out of the buffer storage unit into in the main storage unit passes through an ECC circuit. If the data moved out of the buffer storage unit contains a single-bit error, the ECC circuit corrects the error, and the data, as corrected by the ECC circuit, is stored in the main storage unit.

Accordingly, when a single-bit error is detected in data read from the buffer storage unit in response to an ordinary memory access, the data held in the buffer storage unit may be forcibly replaced by generating the address of data, not in the buffer storage unit, which uses the same buffer storage set (sector) address as the data containing the error, and then accessing the generated address. The data sent back to the main storage unit will be corrected since any data which contains a single-bit error is corrected by the ECC circuit before storage in the main storage unit. Therefore, if all the data in a set (memory sector) including data having a single-bit error are moved out of the buffer storage unit to the main storage unit by generating the necessary number of addresses, the data having the single-bit error will be moved out of the buffer storage unit. Since this one-bit error is corrected in the ECC circuit and the corrected data is stored in the main storage unit, when this data in the main storage unit is recalled to the buffer storage unit by another normal access, the corrected data will be transferred to and held in the buffer storage unit.

A system for treatment of a single-bit error in a buffer storage unit in accordance with one embodiment of the present invention will be described in detail with reference to FIGS. 1 and 2. FIG. 1 is a block diagram of the above-mentioned system. FIGS. 2A, 2B and 2C illustrate memory structures of an error address register, a buffer storage unit, and a main storage unit, respectively. In FIG. 1, 1 is a main storage unit, 2 is a buffer storage unit, 3 is an ECC circuit, 4 is a control address circuit, 5 is a pipeline processor, 6 is a tap register, 7 is a comparator, 8 is a decoder, 9 is a "least recently used" (LRU) determining circuit, 10 is a replace instruction controller, 11 is a data selector, 12 is a data line selector, 13 is an error address register, 20 is a central processing unit (CPU), 21 is an error address register, 22 is a fetch address controller, 23 is a fetch address generator, 24 is a selector, 25 is a first address register, 26 is a comparator, 27 is a gate circuit, 28 is a second address register, 29 is a fetch request controller, and 30 is a down counter.

In the main storage unit 1, data necessary for data processing are stored. The main storage unit 1 has a set-structure as shown in FIG. 2C, for example, from SET 0 to SET 1023, each block having 64 bytes of data. The buffer storage unit 2 is used for holding a portion of the data stored in the main storage unit 1. The buffer storage unit 2 has the same set structure from SET 0 to SET 1023 as the main storage unit 1, each SET hving four blocks. In the buffer storage unit 2, the data is held in a set-associative manner, in which the data stored in the main storage unit 1 is held in a block having the same SET number in the buffer storage unit 2.

The ECC circuit 3 is used for checking and correcting single-bit errors in the data output from the buffer storage unit 2, the input data (DATA IN) from the CPU 20, and the data read from the main storage unit 1, and for checking plural bit errors in the data output from the buffer storage unit 2, the input data (DATA IN) from the CPU 20, and the data read from the main storage unit 1. The control address circuit 4 is used for outputting the address necessary for data processing. The pipeline processor 5 is used for holding the address to determine whether requested data exists in the buffer storage unit 2 and whether the data read from the buffer storage unit 2 contains a single-bit error, and for outputting the address to the appropriate portions of the system in a pipeline manner.

The tag register 6 is used for holding the block number in the main storage unit 1 for the data stored in the buffer storage unit 2 in order to judge whether the requested data is held in the buffer storage unit 2. The LRU determining circuit 9 is used to determine the order of the blocks in each SET, i.e., which block is accessed least recently, in order to determine the block to be replaced when a block not held in the buffer storage unit 2 is accessed. The replace instruction controller 10 is used for controlling the selection of the data to be replaced by the instruction from the LRU determining circuit 9 when the replacement is required. The data selector 11 is used for selecting a particular block from the four blocks of data in each SET output from the buffer storage unit 2. The data line selector 12 is used for selecting the data to be supplied to the ECC portion 3 from among the output data from the data selector 11, the input data, and the data output from the main storage unit 1.

The fetch address generator 23 is used for generating address data having the same SET number as the SET holding the data containing the single-bit error in order to correct any detected single-bit error. For example, when the buffer storage unit 2 has a four-block structure for each SET and block $A_0$ in SET 0 contains a single-bit error, as shown in FIG. 2B, the fetch address generating portion 23 generates the addresses of the block having the same SET number as the block $A_0$ but not held in the buffer storage unit 2, for example, $A_1$ to $A_4$ as shown in FIG. 2C. If the four blocks $A_1$ through $A_4$ following block A are not held in the buffer storage unit 2, block $A_0$ can be reliably replaced by generating and accessing these four addresses $A_1$ through $A_4$, successively.

The address of each data stored in the main storage unit 1 has the bit structure illustrated in FIG. 2A. The initial 16 bits, BIT 0 through BIT 15, indicate the block address number MS-ASS, the following 10 bits, BIT 16 through BIT 25, indicate the SET address number, and the last 6 bits, BIT 26 through BIT 31, indicate the byte number in each block. Thus, the successive four blocks $A_1$ through $A_4$ can be generated by changing the preceeding 16 bits BIT 0 through BIT 15.

If any of the four blocks $A_1$ through $A_4$ is held in the buffer storage unit 2, however, the required replacement may not result from the generator of the first four block addresses. Thus, in order to be certain to replace the data having the single-bit error in the buffer storage unit 2, it is necessary to generate and access at least seven other block addresses having the same SET number as the data containing the single bit error. The fetch request controller 29 is used for generating an access request to the main storage unit 1 in accordance with the data addresses output from the fetch address generator 23. The down counter 30 is used for counting the number of access requests generated up to the required number, that is, seven in the above-mentioned example.

The operation of the above-mentioned system for treatment of a single-bit error will now be described with reference to the accompanying drawings. When accessing the data, necessary for data to the main storage unit 1, the access data address is supplied to the control address portion 4 through a route not shown in FIG. 1 and then supplied to the pipeline processor 5 and to the tag register 6. If the required data exists in the buffer storage unit 2, the block number output from the pipeline processing portion 5 and the block number output from the tag portion 6, which are compared in the comparator 7, are equal, and this block number is decoded by the decoder 8. The output of the decoder 8 is supplied to the data selector 11, and the data in that block is selected from among the data in the same SET number output from the buffer storage unit 2. The selected block of data is supplied to the ECC circuit 3 through the data line selector 12 and is checked by the ECC circuit 3. If no error exists in the checked data, the data is output.

On the other hand, if the check shows that a single-bit error exists, the ECC circuit 3 corrects the data and outputs the corrected. At the same time, the ECC circuit 3 outputs a control signal to the error address register 13. The error address register 13 receives the address of the data containing the single bit error, which address is supplied from the pipeline processor 5. The error address register 13 also indicates a one-bit error. The address data in the error address register 13 is supplied to the CPU 20 and put into the error address register 21 of the CPU 20. At this time, the control for single-bit error correction processing is started in the CPU 20.

In the CPU 20, the fetch address controller 22 starts to operate and controls the selector 24 to pass the MS 16 bits of the error address register 21 to the first address register 25. The first address register 25 receives the MS 16 bits, which corresponds to the block number. The 16 bits of data in the first address register 25 is supplied to the fetch address generator 23, the comparator 26, and the gate circuit 27. In the comparator 26, the 16 bits of data from the first address register 25 is compared with the MS 16 bits in the error address register 21. At first, they are equal. In this case, the comparator 26 turns the gate circuit 27 off.

Then, the fetch address generator 23 increments the 16 bits of data by +1. The incremented 16 bits of data is supplied to the first address register 25 through the selector 24 and put into the first address register 25. Then, the data from the first address register 25 is compared with the MS 16 bits of the error address register 21 in the comparator 26. In this case, they are not equal. Thus, the comparator 26 turns the gate circuit 27 on to pass the 16 bits of data to the second address register 28. The address data in the error address register 21 is also supplied to the second address register 28. In other words, the address data formed by combining these two sources of address data is put into the second address register 28. Then, the address data from the second address register 28 is supplied to the fetch request controller 29. The fetch request controller 29 outputs an access request for the main storage unit 1. This access request is also supplied to the control address circuit 4.

The control address circuit 4 starts to operate in response to the access request. The access address is compared with the address from the tag register 6 in the comparator 7. In the case where none of the addresses in the tag register 6 are equal to the access address, the replace instruction portion 10 moves the block indicated by the LRU determining circuit 9 out of the buffer storage unit 2, then reads the block indicated by the access address from the main storage unit 1. The accessed block is then put into the buffer storage unit 2. At this time, the data moved out from the buffer storage unit 2 is checked in the ECC circuit 3 and corrected if it contains a single-bit error before being stored in the main storage unit 1. The 16 bit data in the fetch address generator 23 is then incremented by +1, and a new address is thus generated. The access operation described above is repeated for the new address.

As described above, if no block held in the same SET of the buffer storage unit 2 has the same block number as the generated address, one of the four blocks in the same SET is moved out of the buffer storage unit 2 every time a new address is generated and accessed. Thus, in the buffer storage unit 2 having the structure illustrated in FIG. 2B, by generating and accessing seven different addresses, the block containing the data with a single-bit error is certain to be moved out from the buffer storage unit 2, corrected in the ECC circuit 3, and stored in the main storage unit 1. Therefore, if this block is read out of the main storage unit 1 at a later time, the correct data for this block will be put into the buffer storage unit 2. After replacing the data containing the single-bit error in the buffer storage unit 2 as described above, a machine check interrupt is generated for the software, and the processing is completed.

The down counter 30 may be used for controlling the number of the addresses generated by the fetch address generator 23. A predetermined number is preset in the down counter 30. Each time a new address is generated by the fetch address generator 23 the down counter 30 is decremented by one. When the down counter 30 reaches zero, the access operation is completed. The predetermined number is selected to ensure that the data containing the single-bit error is moved out of the buffer storage unit 2. In the above-mentioned type of buffer storage unit, the number required is seven. Of course, the required number of data replacements may be changed in accordance with the memory structure of the buffer storage unit 2. Thus, a system according to the present invention may be constructed so that the number of addressed generated can be selected according to the condition of the data processing.

In the above system according to the present invention, when a single-bit error is detected in the buffer storage unit 2, an interrupt is first generated for the firmware (a term which includes some of the units described above including any "microprograms" they use) without generating a machine check interrupt for the software. Then, the firmware control recognizes that the cause of the interrupt is single-bit error, reads the address of the data containing an error, and carries out the above-described processing.

According to the present invention, when a single-bit error is detected in a buffer storage unit in which N ways of replacement of data are possible, the data containing the single-bit error can be reliably corrected by accessing addresses in the same SET as the data containing the error at least N times. Therefore, even if the data containing the error is accessed in repeatedly, multiple machine check interrupts will not be generated, allowing the data processing to be carried out efficiently.

What is claimed is:

1. A system for treatment of single-bit errors in a buffer storage unit included in a data processing device, said data processing device comprising a main storage unit for storing data in blocks; a buffer storage unit for holding a multiple block portion of the data stored in said main storage unit in memory sectors of the buffer storage using a set-associative scheme; an error check and correct circuit, operatively connected to said main storage unit and said buffer storage unit, for checking and correcting single-bit errors and checking plural bit errors, the data stored in said buffer storage unit passing through said error check and correct circuit during read and write operations, said system for treatment of single-bit errors comprising:

error-data address holding means, operatively connected to said error check and correct circuit, for holding an address for data in said buffer storage unit which is found to contain a single-bit error during a read operation of said buffer storage unit; and memory address generating means, operatively connected to said error-data holding means and said buffer storage unit, for generating addresses for blocks in said main storage unit, other than the block containing the single-bit error, corresponding to a predetermined memory sector of said buffer storage unit which holds the data containing the single-bit error, until the data containing the single-bit error is moved out from the predetermined memory sector of said buffer storage unit, checked and corrected in said error check and correct circuit and stored in said main storage unit.

2. A system as defined in claim 1, further comprising a down counter, operatively connected to said memory address generating means, for counting a number of addresses generated by said memory address generating means.

3. A data processing system as recited in claim 2, wherein each of the memory sectors of said buffer storage contain a predetermined number of blocks and the number of addresses counted by said down counter equals one less than twice the predetermined number of blocks.

4. A data processing system as recited in claim 1,
wherein each of the memory sectors of said buffer storage contains a first number of blocks, and
wherein said memory address generating means generates addresses for a second number of blocks, the second number being one less than twice the first number.

5. A data processing system which detects and corrects single-bit errors in a buffer storage unit, comprising:
processing means for processing data;
a main storage unit, operatively connected to said processing means, for storing data in blocks;
a buffer storage unit, operatively connected to said processing means, for storing some of the blocks of data stored in said main storage unit;
an error check and correct circuit, operatively connected to said main storage unit and said buffer storage unit, for checking data read from said main storage unit and said buffer storage unit to correct single-bit errors and detect plural-bit errors; and
block writing means, operatively connected to said buffer storage unit and said error check and correct circuit, for responding to the detection of a single-bit error in a block of data read from said buffer storage unit by generating request addresses of blocks of data in said main storage unit and for causing the transfer of the block of data containing the single-bit error from said buffer storage unit to said main storage unit via said error check and correct circuit, thereby storing a block of data in said main storage unit with the single-bit error corrected, substantially simultaneously with the transfer of the blocks of data from said main storage unit to said buffer storage unit in response to the request addresses.

6. A data processing system as recited in claim 5, wherein said block writing means comprises:
an error address register, operatively connected to said error check and correct circuit, for storing an address of the block of the data in said buffer storage unit containing the single-bit error; and
error address generator means, operatively connected to said error address register and said buffer storage unit, for generating the request addresses for the blocks of data in said main storage unit which cause the transfer of the block of data in said buffer storage unit containing the single-bit error into the main storage unit.

7. A data processing system as recited in claim 6, wherein said buffer storage unit stores the blocks of data from said main storage unit in buffer sets which correspond to main sets in said main storage unit, and
wherein said error address generator means generates a number of addresses of blocks of data in a corresponding main set which includes a block of data corresponding to the block of data containing the single bit error, the number of addresses equaling one less than twice as many blocks of data in one of the buffer sets.

8. A data processing system as recited in claim 6, wherein said error address generator means comprises:
a selector operatively connected to said error address register;
a fetch address controller operatively connected to said selector;
a first address register operatively connected to said selector;
a fetch address generator operatively connected to said first address register and said selector;
a comparator operatively connected to said error address register and said first address register;
a gate operatively connected to said first address register and said comparator;
a second address register operatively connected to said error address register and said gate; and
a fetch request controller operatively connected to said second address register and said buffer storage unit.

9. A data processing system as recited in claim 8,
wherein said buffer storage unit stores the blocks of data from said main storage unit in buffer sets which correspond to main sets in said main storage unit,
wherein said fetch address generator generates addresses of blocks of data in said main storage unit, other than the block of data corresponding to the block of data in said buffer storage unit containing the single-bit error, in a main set corresponding to a buffer set which includes the block of data containing the single-bit error, and
wherein said error address generator means further comprises a counter for counting a number of addresses generated by said fetch address generator and sending a signal to said fetch request controller when the number counted is sufficient to ensure that the block of data in said buffer storage unit containing the single-bit error will be transferred to said main storage unit.

10. A data processing system as recited in claim 9, wherein the number counted by said counter is equal to one less than twice as many of the blocks of data as are included in one of the buffer sets.

11. A data processing system as recited in claim 10, wherein said counter is a down counter.

* * * * *

UNITED STATES PATENT AND TRADEMARK OFFICE
CERTIFICATE OF CORRECTION

PATENT NO. : 4,598,402

DATED : July 1, 1986

INVENTOR(S) : Toshio Matsumoto et al.

It is certified that error appears in the above-identified patent and that said Letters Patent is hereby corrected as shown below:

Col. 1, line 52, "repeated" should be --repeatedly--.

Col. 2, line 36, delete "in".

Col. 3, line 5, "tap" should be --tag--;
line 23, "hving" should be --having--.

Col. 4, line 1, "ating portion" should be --ator--;
line 20, "generator" should be --generation--;
line 35, "to" should be --processing, in--;
line 54, after "corrected" insert --data--.

Col. 6, line 8, "addressed" should be --addresses--;
line 26, delete "in".

Signed and Sealed this

Eleventh Day of November, 1986

*Attest:*

DONALD J. QUIGG

*Attesting Officer*  *Commissioner of Patents and Trademarks*